United States Patent Office 3,520,685

Patented July 14, 1970

3,520,685

ETCHING SILICON DIOXIDE BY DIRECT PHOTOLYSIS

Donald L. Schaefer, Schenectady, N.Y., assignor to General Electric Company, a corporation of New York No Drawing. Filed May 29, 1967, Ser. No. 642,149
Int. Cl. G03c *5/00*
U.S. Cl. 96—36 4 Claims

ABSTRACT OF THE DISCLOSURE

A process is disclosed whereby the surface of a body of silicon dioxide is placed in contact with an etchant comprising a photodecomposable fluorine compound in an organic polymeric solid film and the interface between the surface and the film exposed to a pattern of activating radiation in a humid atmosphere to produce chemically reactive fluoro species whereby the silicon dioxide surface is preferentially etched in the illuminated areas.

The invention herein described was made in the course of a contact with the Bureau of Ships, United States Navy.

Attention is drawn at this point to the patent application Ser. No. 642,159, Schaefer, entitled "Photolytic Etching of Silicon Dioxide" filed concurrently herewith and assigned to the assignee of the present invention.

BACKGROUND OF THE INVENTION

In the past when it has been desired to etch the surface of glass or quartz materials for either decorative or optical purposes, or to etch patterns through silicon dioxide surface films formed on the surfaces of so-called silicon "chips" for use as semiconductive circuit elements in miniaturized "integrated" circuits, it has been necessary to coat those areas which are not to be etched with a protective layer of a material which is resistant to the etchant, leaving exposed those areas which are to be etched. The etchant, usually hydrofluoric acid or a solution with ammonium fluoride is then applied and etching of the surface is accomplished in those exposed areas. Where a high degree of precision is necessary in forming the etched pattern as, for example, in the manufacture of optical reticles or in the manufacture of silicon chips, it has been conventional to use a suitable "photoresist" process. In general, these processes have involved coating the surface to be etched with a material which, when suitably irradiated, is converted from a soluble to an insoluble material. In practice, the surface to be etched is coated with the material, exposed to the desired pattern of activating radiation through an appropriate photographic negative, for example, and the unexposed still soluble areas of the coating removed by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and the etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants employed in the etching of silicon dioxide are toxic and in the case of hydrofluoric acid, extremely dangerous to use. It would be advantageous to eliminate the necessity for the use of the photoresist material, the multiple step process attendant therewith and the use of the harardous etchants.

It is therefore a principal object of this invention to provide a process for etching predetermined patterns in surfaces composed essentially of silicon dioxide which does not require the use of a mask of the photoresist type or the use of etchants containing hydrofluoric acid.

It is a further object of this invention to provide a method for the selective etching of a silicon dioxide surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of surfaces composed primarily of silicon dioxide comprising the steps of casting a solid film of an organic polymer containing a photolyzable organic fluorine compound such as trityldifluoroamine or fluoranil on the surface to be etched, exposing the interface between said film and said surface to a pattern of activating radiation in a humid atmosphere to produce chemically reactive species at the interface which attack and etch the surface in the illuminated areas of the pattern at a rate which is dependent in part upon the intensity of the radiation and time, and stripping the film from the surface to expose the etched surface.

DESCRIPTION OF THE PREFERRED EMBODIMENTS

More particularly, the following examples illustrate how the invention may be practiced.

Example 1

A 0.2 molar solution of trityldifluoroamine, $$(C_6H_5)_3CNF_2$$

in a 20 percent low molecular weight polystyrene (about 20,000 average molecular weight) in benzene with small amounts of xylene, toluene and hexafluorobenzene added to improve drying characteristics was prepared. A film of the polymer about 20 microns in thickness was cast upon the surface of an approximately 6000 A. thick layer of silicon dioxide formed on the surface of a silicon wafer about 1 inch in diameter. A metal pattern was placed over the polymer surface and was illuminated for one hour with a 1000 watt high intensity mercury lamp in an atmosphere of high humidity. The polymeric layer was dissolved from the silicon dioxide surface by washing with benzene and upon inspection, a pattern was found to be etched into the silicon dioxide surface which had an exact, point-to-point correspondence to the illuminated areas produced by the pattern and no discernible etching occurred in non-illuminated areas.

Example 2

The procedure set forth in Example 1 was repeated except the etching film was deposited on a quartz plate. Again, after the polymeric material had been similarly exposed and removed, the same type of pattern was found etched into the quartz surface.

The procedures set forth above have been repeated a number of times substituting polymers such as ASB (an alcohol soluble butyrate resin manufactured by the Eastman Chemical Co.) and RJ-100 (a hydroxylated polymeric resin manufactured by the Monsanto Chemical Corporation) for the polystyrene resin, and substituting fluoranil, $C_6F_4O_2$, for the trityldifluoroamine, all of which produced similar results. It should be here noted that exposure of these polymeric organic films to the activating radiation should be accomplished while in a fairly high relative humidity environment for efficient etching. It would appear that the presence of water vapor is desirable if not necessary. It should also be pointed out that these coating solutions are relatively stable in room light. For example, a trityldifluoroamine solution as described in Example 1 was used over a period of a week with no apparent degradation or protection from room light.

While a carbon-fluorine bonded compound, fluoranil, has been disclosed as operative in the present invention, the nitrogen-fluorine bonded compounds such as trityldifluoroamine, for example, are preferred since they have a lower fluorine bond dissociation energy, namely 62 kilocalories per mole.

From the foregoing, modifications of the processes and materials disclosed for purposes of the disclosure will readily occur to those skilled in the art, all within the scope of the invention. For that reason, it is not intended to limit the invention in any way except as defined by the following claims.

What I claim as new and desire to secure by Letters Patent of the United States is:

1. A method for photoetching a surface composed primarily of silicon dioxide comprising the steps of contacting said surface with a solid film of an organic polymeric material containing an organic photodecomposable fluorine compound selected from the group consisting of trityldifluoroamine and fluoranil to form an interface therebetween, said photodecomposable compound being decomposable upon exposure to activating radiation to form chemically reactive species which in the presence of water vapor attack and etch silicon dioxide and exposing said interface to a pattern of activating radiation while said polymeric film is exposed to a humid atmosphere providing sufficient water vapor whereby said surface is etched in the illuminated areas.

2. The method set forth in claim 1 wherein said fluorine compound is trityldifluoroamine.

3. The method set forth in claim 1 wherein said fluorine compound is fluoranil.

4. The method set forth in claim 1 wherein said organic polymeric film is soluble and is formed by casting a solution of said polymer and said fluorine compound upon said surface and subsequently evaporating said solvent therefrom.

References Cited

UNITED STATES PATENTS

| | | | |
|---|---|---|---|
| 2,841,477 | 7/1958 | Hall | 204—157.1 X |
| 2,875,046 | 2/1958 | Marron et al. | 96—36 X |
| 3,255,005 | 6/1966 | Green | 96—36 |
| 3,271,180 | 9/1966 | White | 96—36 X |
| 3,346,384 | 10/1967 | Gaynor | 96—36 |
| 3,122,463 | 2/1964 | Ligenza et al. | 156—16 X |

GEORGE F. LESMES, Primary Examiner

R. E. MARTIN, Assistant Examiner

U.S. Cl. X.R.

96—36.2; 156—4, 17